US005675126A

United States Patent [19]

Halvorsen

[11] Patent Number: 5,675,126

[45] Date of Patent: Oct. 7, 1997

[54] OUTLET COVER

[76] Inventor: Gary Halvorsen, 16 Villanova Dr., Kendall Park, N.J. 08824

[21] Appl. No.: 514,015

[22] Filed: Aug. 11, 1995

[51] Int. Cl.[6] .......... H05K 5/03

[52] U.S. Cl. .......... 174/67; 220/242

[58] Field of Search .......... 174/66, 67; 220/241, 220/242, 3.8

[56] References Cited

U.S. PATENT DOCUMENTS

| | | | |
|---|---|---|---|
| 3,331,915 | 7/1967 | Lucci . | |
| 3,634,732 | 1/1972 | Finger et al. | 317/120 |
| 3,716,815 | 2/1973 | Riches | 220/3.8 X |
| 4,159,858 | 7/1979 | Toraya | 174/67 X |
| 4,228,317 | 10/1980 | Cziment . | |
| 4,250,349 | 2/1981 | Bennett | 174/67 |
| 4,451,101 | 5/1984 | Davis | 174/67 X |
| 4,508,933 | 4/1985 | Carvel | 174/67 |
| 4,660,912 | 4/1987 | Tomek . | |
| 4,743,206 | 5/1988 | Imhoff . | |
| 4,801,271 | 1/1989 | Piper | 174/67 X |
| 4,952,755 | 8/1990 | Engel et al. | 174/67 |
| 4,970,349 | 11/1990 | Jones | 174/67 |
| 4,988,832 | 1/1991 | Shotey | 174/67 |
| 5,064,969 | 11/1991 | Bloom . | |
| 5,106,326 | 4/1992 | Tsuji et al. . | |
| 5,280,135 | 1/1994 | Berlin et al. | 174/67 |

FOREIGN PATENT DOCUMENTS

| | | | |
|---|---|---|---|
| 636821 | 5/1950 | United Kingdom | 174/66 X |

*Primary Examiner*—Kristine L. Kincaid
*Assistant Examiner*—Dean A. Reichard
*Attorney, Agent, or Firm*—Jordan and Hamburg

[57] ABSTRACT

An outlet cover, for an electrical outlet, that is attachable over the electrical outlet itself or a face plate thereof. The outlet cover has a plate member with apertures for permitting access to sockets of the electrical outlet. Hinged doors swing to allow access to the sockets and to cover the sockets. A latch mechanism latches the doors shut over the sockets to eliminate a electrical shock hazard potential to children. The doors may be opened via an opening in a side surface of the outlet cover so positioned to be inconspicuous. The opening provides clearance for a prong, of an electrical plug, to be inserted therein to release the latch mechanism. Alternatively, a slot may be provided in the side surface to accept a human nail, a pencil point, or a pin that may be used to release the latch, either alone or in conjunction with a further mechanism for acting on the latch mechanism. An embodiment of the invention has the doors configured to lie flush with a face surface of the outlet cover.

15 Claims, 4 Drawing Sheets

OUTLET COVER

BACKGROUND OF THE INVENTION

The present invention relates to a cover for an electrical outlet, and more particularly, to an outlet cover having hinged doors and a latching mechanism releasable via an access aperture disposed on the side of the cover. The outlet cover is installable over the face plate of conventional electric outlets.

Electrical outlets in the home present an electrical shock hazard to small children who are prone to insert objects in to the electrical outlets. In order to protect small children from such a hazard, various electric outlet covering devices have been devised. A common example of such a device is a plastic shield which has plastic prongs that are inserted into the electrical outlet socket. In order to use the socket the user then extracts the shield from the socket and inserts the electric plug. The insertable shield device is limited in its usefulness in that it may be easily removed by children. Additionally, because the shield device is removed from the electrical outlet in order to use the electrical outlet, the shield device is prone to becoming lost and subsequently not reinserted after use of the electrical outlet. Furthermore, the insertable shield device presents an attraction to small children in that it stands out from the rest of the electrical outlet and presents the challenge of removal.

Other devices for guarding against electric shock hazards include plates that mount to the electric outlet and have hinged doors thereon to provide access to the electric sockets. Examples of such devices are shown in U.S. Pat. No. 4,660,912, U.S. Pat. No. 4,228,317, and U.S. Pat. No. 5,064,969. The device disclosed in U.S. Pat. No. 4,660,912 has two doors hinged to a cover plate of an electrical outlet. When closed, the doors latch and protrude above the surface of the cover plate. In order to open the doors, two slots are provided in a face of the doors for the insertion of the prongs of an electrical plug. Once inserted, the prongs trigger a latching mechanism to release the door thereby allowing access to the electrical socket. Since the doors of this device protrude above the surface of the cover plate when closed, they present an attraction to a young child, spurring the child's interest in the challenge of opening the door. The slots in the door are readily apparent and invite a child to insert objects therein. Once an object is inserted in a slot, the door will open thus presenting a shock hazard.

The devices disclosed in U.S. Pat. Nos. 4,228,317 and 5,064,969 each have mountable cover plates with hinged doors. The doors latch shut when closed. In order to open the doors, there are provided two recesses in the cover plates adjacent to the doors to allow one to pry open the doors using a fingernail or other object. The recesses in the cover plate once again present an attraction for young children, inquisitive in nature, and seeking a challenge in discovering how to open the doors. Since the recesses used for opening the doors are readily visible, young children may readily circumvent the safety device.

In U.S. Pat. No. 4,743,206, a cover plate device is disclosed which has pivotable covers which rotate in the plane of the cover plate. The pivotable covers have openings in their front surfaces that correspond to the prongs of a common electrical plug. In order to utilize the electrical outlet, the plug is partially inserted to the openings of the covers and used to swing the cover to a position where the plug is placed in alignment with the electrical socket and then fully inserted. Similar to the devices discussed above, the device presents an attraction to children by having the openings in the covers corresponding to the prongs of the electrical plug exposed, inviting investigation by children.

In view of the substantial hazard presented by electrical outlets in the home, an effective and convenient electrical cover plate which prevents children from gaining access to electrical outlets would be welcomed. Such a device would desirably present little attraction to children and have a release mechanism for covers over the electrical outlets which is not readily apparent.

SUMMARY OF THE INVENTION

Accordingly, it is an object of the invention to provide an outlet which overcomes the drawbacks of the prior art.

It is a further object of the invention to provide an outlet cover without parts detachable from an electrical outlet.

It is a still further object of the invention to provide an outlet cover which does not present features which attract the attention of young children.

It is yet another object of the invention to provide an outlet cover having an inconspicuously disposed release mechanism.

An object of the present invention is to provide an outlet cover which is inexpensive to manufacture and ensures secure protection of children from electrical shock hazards.

Briefly stated, the present invention provides an outlet cover, for an electrical outlet, that is attachable over the electrical outlet itself or a face plate thereof. The outlet cover has a plate member with apertures for permitting access to sockets of the electrical outlet. Hinged doors swing to allow access to the sockets and to cover the sockets. A latch mechanism latches the doors shut over the sockets to eliminate a potential electrical shock hazard. The doors are opened via an opening in a side surface of the outlet cover so positioned to be inconspicuous. The opening provides clearance for an electrical plug prong to be inserted to release the latch mechanism. Alternatively, a slot may be provided in the side surface to accept a human nail, a pencil point, a pin or similar object to release the latch, either alone or in conjunction with a further mechanism for acting on the latch mechanism. An embodiment of the invention has the doors configured to lie flush with a face surface of the outlet cover.

In accordance with these and other objects of the invention, there is provided a covering apparatus for an electrical outlet, wherein the electrical outlet has a socket for accepting a plug with a prong and a fastening means for attaching a face plate. The covering apparatus includes a plate member having a face surface, a side surface, and a rear surface opposite the face surface. The plate member defines an aperture in the face surface sufficient in size to permit access to the socket and has a means for permitting fastening to the fastening means spaced relative to the aperture to functionally align the aperture with the socket. The plate member also has a door and hinge means for hinging the door from the plate member permitting the door to swing between a first position whereat the door covers the socket and a second position whereat the socket is exposed. Further included is latch means for latching the door in the first position, and release means for permitting release of the latch means actuable via the side surface of the plate member.

An optional feature of the above embodiment is the release means including the plate member defining an opening extending from the side surface to the latch means where the opening is dimensioned to accept the prong. The latch means is spaced from the side surface a distance less than a length of the prong, and the latch means has a means for permitting release of the latch means by insertion of the prong in the opening. Optionally, the opening is a hole which is spaced from the rear surface a distance sufficient to permit clearance between the plug and one of the face plate and a wall into which the electrical outlet is mounted when the prong is inserted into the opening to release the door.

Alternatively, a feature provided by the present invention is the opening being a recess in the rear surface extending from the side surface to the latch means. The recess has a bottom surface, parallel the face surface, spaced from the rear surface a distance sufficient to permit clearance between the plug and one of the face plate and a wall, into which the electrical outlet is mounted, when the prong is inserted into the opening to release the door.

The present invention also provides a covering apparatus for an electrical outlet, wherein the electrical outlet has a socket for accepting a plug with a prong and a fastening means for attaching a face plate, the covering apparatus including a plate member having a face surface, first and second sides opposite each other, a rear surface opposite the face surface, and an aperture in the face surface sufficient in size to permit access to the socket. The plate member has a means for permitting fastening to the fastening means spaced relative to the aperture to functionally align the aperture with the socket. The plate member also has a door and hinge means for hinging the door from the plate member at the first side permitting the door to swing between a first position covering the socket and a second position whereat the socket is exposed. There is also included latch means for latching the door in the first position, and release means for permitting release of the latch means actuable via the second side of the plate member.

Yet another feature of the present invention includes the hinge means being a living hinge.

The present invention also includes the above embodiments wherein, in the alternative, the door has a shape substantially conforming to a perimeter of the aperture allowing the door to fit within the aperture at the first position whereat the door is substantially flush with the face surface, and a combination of the face surface and the door presents an apertureless substantially flat continuous surface when the apparatus is installed on the electrical outlet.

The above, and other objects, features and advantages of the present invention will become apparent from the following description read in conjunction with the accompanying drawings, in which like reference numerals designate the same elements.

DETAILED DESCRIPTION OF THE INVENTION

Figure 1:
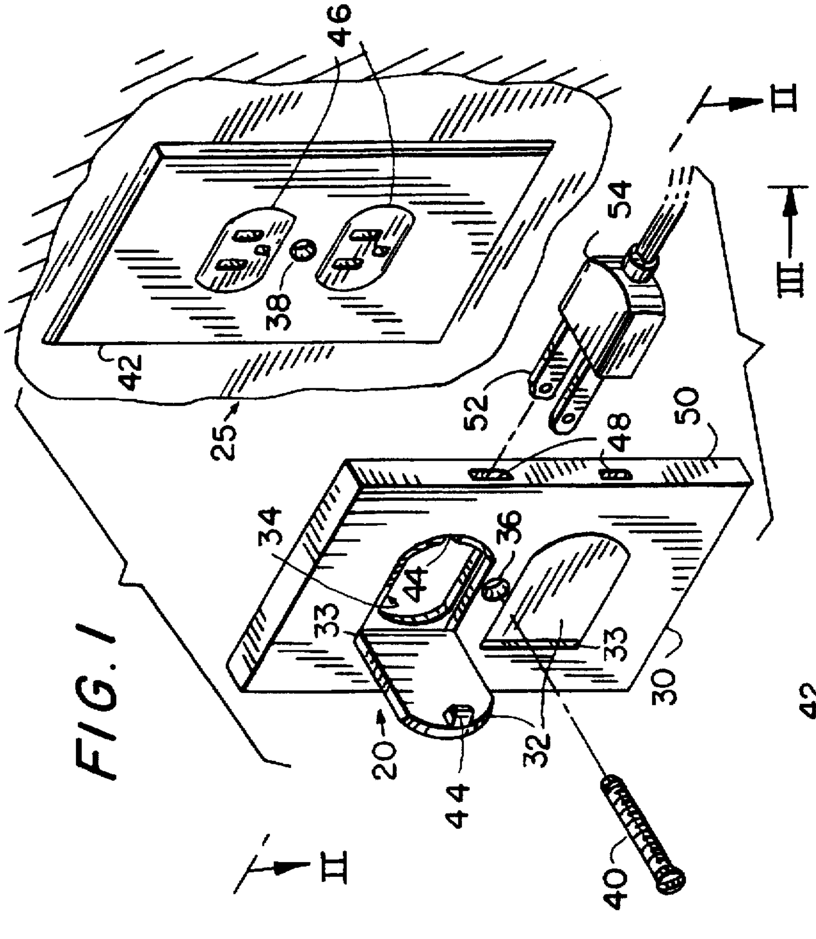
FIG. 1 is a perspective view of an embodiment of the present invention shown in relation to an electrical outlet and electrical plugs.

Referring to FIG. 1, there is shown an outlet cover 20 for covering an electric outlet 25. The outlet cover 20 includes a plate member 30 having doors 32 attached to the plate member 30 by hinges 33. The plate member 30 has a mounting hole 36 aligned with a screw hole 38 of the electric outlet 20 to accept a screw 40 for fastening the plate member 30 over a face plate 42 of the electric outlet 20. The plate member 30 has socket access apertures 34 that are coverable by the doors 32. The doors 32 each have a latching mechanism 44 that secures that secure the doors 32 in closed positions, as shown in the case of the lower door 32 in FIG. 1, to cover electric sockets 46 of the electric outlet 20.

The plate member 30 has slotted openings 48 in a side surface 50 which communicate with the latching mechanisms 44. The slotted openings 48 are dimensioned to accept a prong 52 of a plug 54 of the type corresponding to the electric sockets 46. Insertion of the prong 52 into the slotted openings accomplishes release of the latching mechanisms 44 of the outlet cover 20. Since the slotted openings 48 are disposed inconspicuously on the side surface 50, they do not present an attraction which would invite investigation by children.

Figure 2:
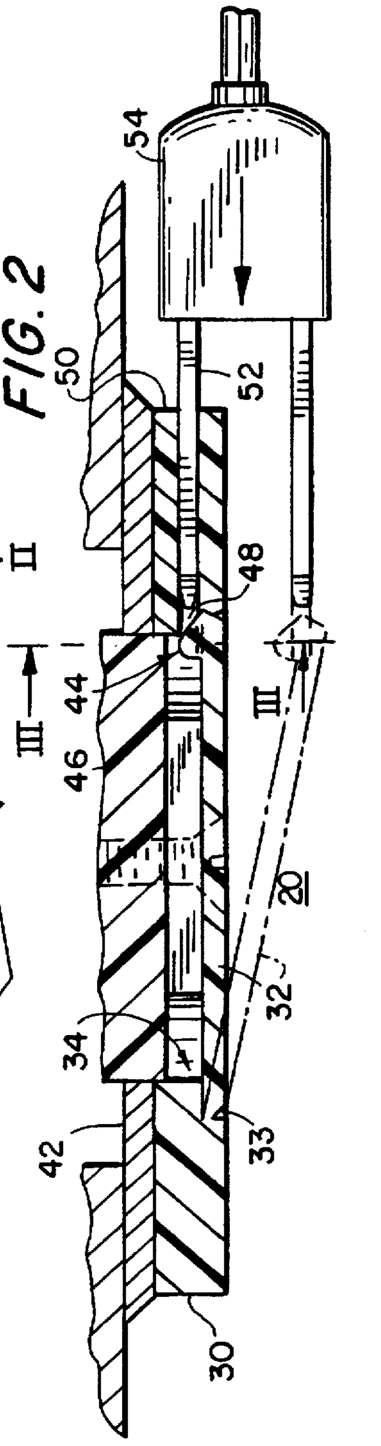
FIG. 2 is a cross-sectional view of the embodiment of FIG. 1 taking along line II—II of FIG. 1.
Figure 3:
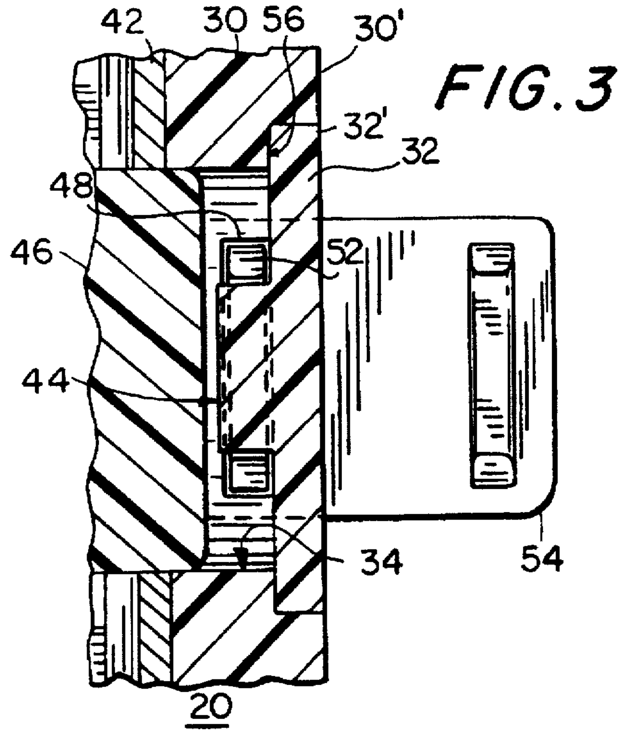
FIG. 3 is a cross-sectional view of the embodiment of FIG. 1 taken along line III—III in FIG. 2.

Referring to FIGS. 2 and 3, the interaction of the latching mechanism 44, the slotted opening 48, and the prong 52 is depicted. The slotted opening 48 extends from the side surface 50 to the latching mechanism 44 allowing the prong 52 to engage the latching mechanism 44 when inserted into the slotted opening 48. The slotted opening 48 guides the prong 52 into engagement with an inclined surface of the latching mechanism 44 to effect opening displacement of the door 32 wherein slight deflection of the door 32 is sufficient to permit disengagement of the latching mechanism 44 from a corresponding indentation in the plate member 30.

In the embodiment of FIGS. 2 and 3 the indentation is formed in part by the slotted opening 48, however, it is realized that alternative latching configurations may be effected by those of ordinary skill in the art, having the benefit of the present disclosure, to achieve the function of the present invention. For example, a detent may be formed in an edge of the door 32 which couples with a resilient protrusion of the plate member 30. The prong may then serve to displace the resilient protrusion away from the door 32 by means of a pivot mechanism or the prong may engage an inclined surface on the door 32 independent of the latching mechanism. Also, the prong 52 need not actually contact the latching mechanism 44 or other structure on the door 32. Intermediate members may be disposed in the slotted opening 48 which are displaced to effect opening of the door 32. Such a configuration allows the use of a wider plate member whose side surface to latching mechanism distance is greater than the length of a standard electrical plug prong. Alternatively, the slotted opening 48 need not be in the form of a slot configured to accept the prong 52; an opening is optionally used which can accept a fingernail, pin, or pen or pencil point which, in turn, function in conjunction with an intermediate member to effect opening of a latching mechanism at the door 32. Additionally, alternative embodiments may have latch mechanisms which are opened by displacement of the door 32 by either the prong 52 or an intermediate member at a location on the door other than at the latch mechanism. These arrangements and others similarly realizable are considered to be within the scope and spirit of the present invention.

The doors 32 and the plate member 30 are hinged together by what is commonly referred to as a living hinge 33. The living hinge 33 is a molded structure comprising a narrowing of the material joining the doors 32 and the plate member 30. One preferred material used in construction of articles with living hinges is polypropylene due to its flexibility and resiliency which permits tens of thousands of hinging motions to be executed without fatigue of the material. Other plastics and materials, including polystyrene, may also be used in the practice of the present invention. It is thus preferable that the doors 32 and plate member 30 be molded as a single piece to effect economy of manufacture. The precise configuration and techniques required to accomplish such molding may be realized by those of ordinary skill in such arts and therefor is not discussed in detail herein.

While one piece molding of the present invention is an advantageous method of manufacture, embodiments of the present invention are realizable which do not require one piece molding. For example, in other embodiments, doors and a plate member are formed separately and are hinged together by common hinge coupling structures such as ball and socket, double-leaf, or pintle configurations formed in or fixed to the doors and plate member. Alternatively, another embodiment has the doors and plate member fitted together and a flexible polypropylene or similar plastic type film laminated over the face surfaces of the doors and plate member to form hinges at hingeable junctions of the doors and plate member while the film is cut around the outline of the doors except at the hinge portions. Other hinge structures may be realized by those skilled in the art and are considered to be within the scope of the present invention.

The doors 32 and plate member 30 are aligned so that the face surfaces of each, 32' and 30', are flush with each other. The alignment is supported by a countersunk surface 56 of the access aperture 34 which generally conforms to the outline of the electric socket 46. The countersunk surface 56 may optionally be omitted, allowing the hinge 33 and latching mechanism 44 to support the doors 32 in an alignment wherein the face surfaces, 32' and 30', are flush with each other. The flush face surfaces, 32' and 30', and otherwise substantially flat and featureless face of the outlet cover 20 create an appearance which does not present attractive features for curious children to investigate. While this is considered to be an advantageous feature of the embodiment shown, it is not necessary that the face surfaces, 32' and 30' be flush because the latching mechanism 44 is only releasable via the inconspicuous slotted opening 48 on the side surface 50 of the plate member 30. Therefore, other embodiments of the present invention may optionally have doors which are not flush with the surface of a plate member yet still provide protection from an electric shock hazard due to the non-obvious opening mechanism.

Figure 4:
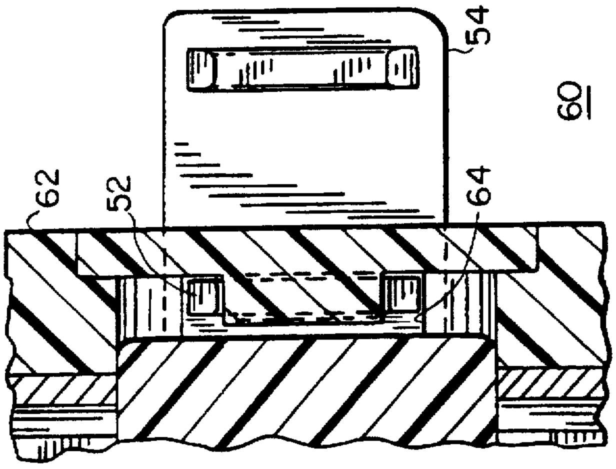
FIG. 4 is a cross-sectional view of another embodiment of the invention taken along line IV—IV of FIG. 5.
Figure 5:
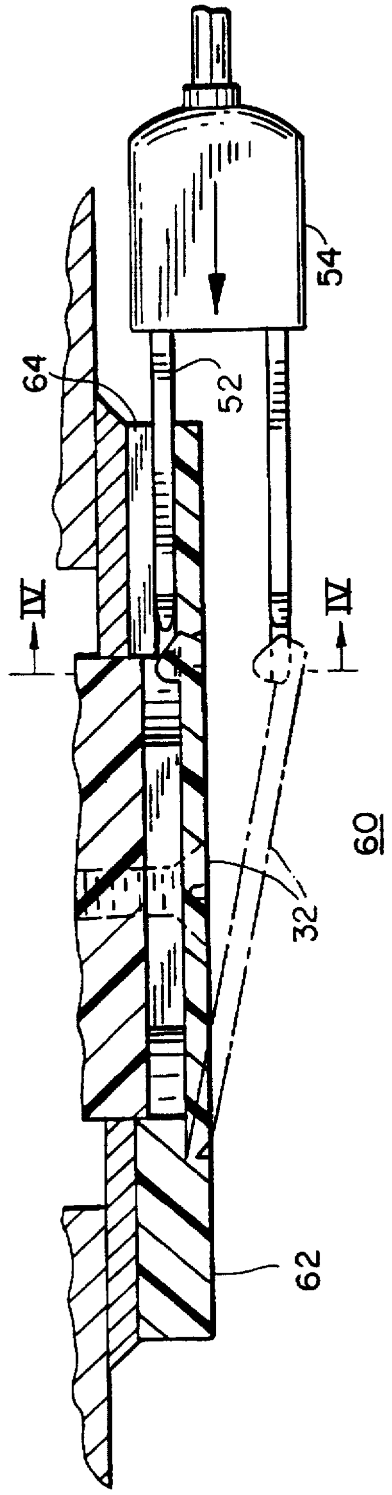
FIG. 5 is a cross-sectional view of the embodiment of FIG. 4 taken along line II—II of FIG. 1.

Referring to FIGS. 4 and 5, an outlet cover 60, representing another embodiment of the present invention is shown and is similar to the outlet cover 20 of FIGS. 1–3 except as discussed herein. The plate member 62 has a channel recess 64 formed in a back surface thereof during molding in place of the slotted opening 48 of outlet cover 20. The channel recess 64 facilitates the manufacture of the plate member 62 as the channel recess 64 may more readily be formed in the molding process. Additionally, the channel recess 64 has a depth which is greater than that of the slotted opening 48 which allows opening of the doors 32 using an elongated member which is thicker than the prong 52. The flexibility in selection of opening tools is important in instances where an appliance, such as a plug mounted transformer commonly used to power compact electronic devices, has an electric plug configuration where the body of the plug is oversized and the prong thereof cannot be positioned to allow insertion into the channel recess 64. In that an event, an object such as a nail file, a knife, or similar elongated member may be substituted in place of the prong 52 to open the doors 32.

Figure 6:
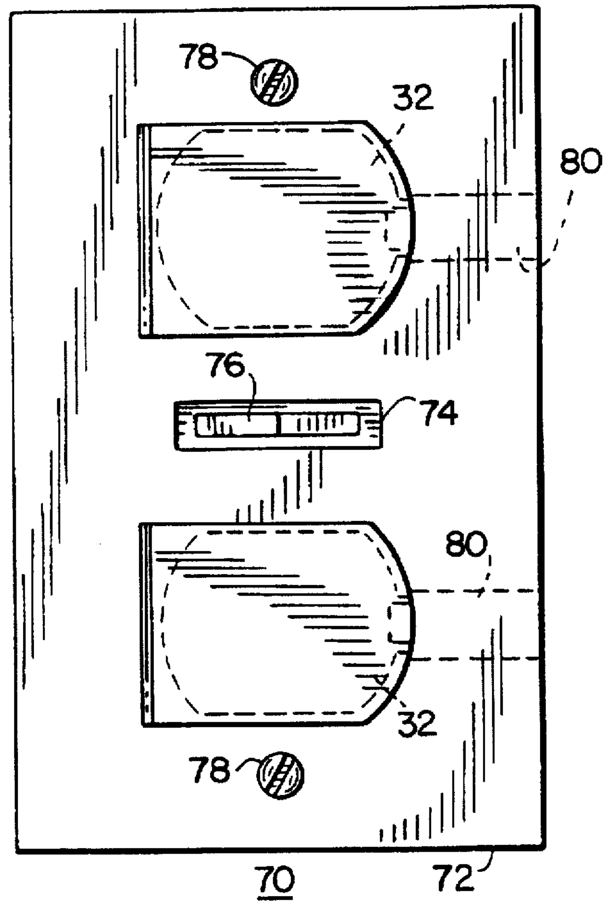
FIG. 6 is a front view of another embodiment of the present invention.

Referring to FIG. 6, an outlet cover 70 of another embodiment of the present invention has a plate member 72 with an aperture 74 permitting access to buttons 76 used to test and reset ground fault circuitry of use in modern electric outlets. Screw holes 78 are disposed above and below the doors 32 to align with the threaded mounting holes (not shown) of the standard electric outlet having ground fault circuitry. The outlet cover 70 is otherwise similar to the above embodiments of the present invention, including the use of slotted openings or channel recesses 80 to provide access to release the doors 32. Further detailed discussion is therefore omitted.

Figure 7:
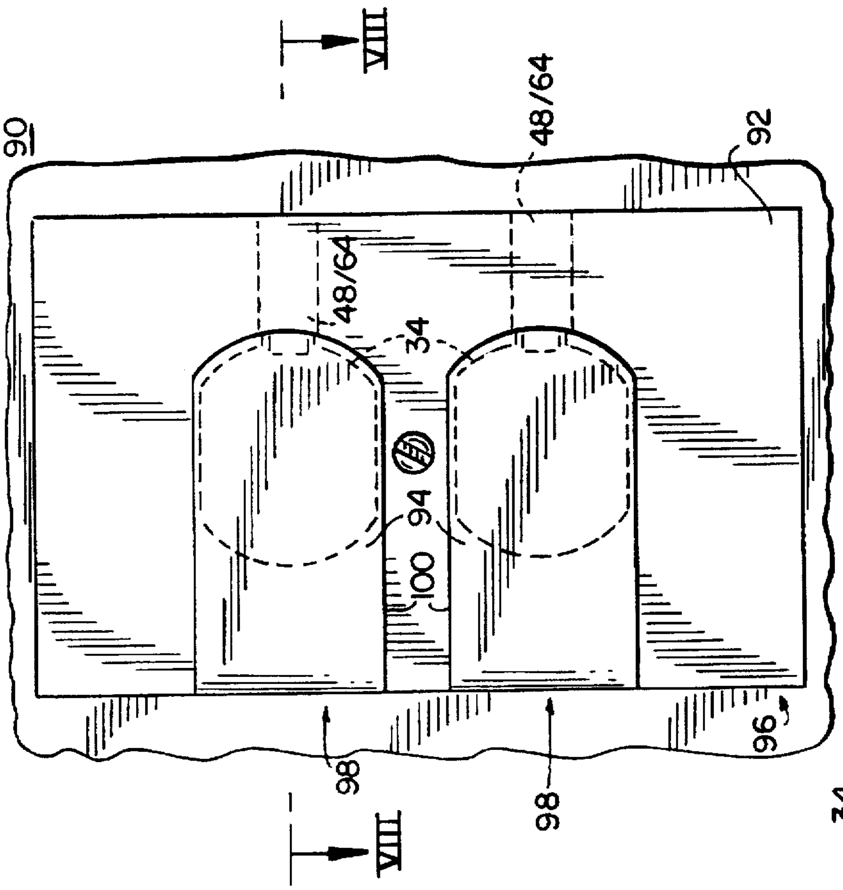
FIG. 7 is a front view of another embodiment of the present invention.
Figure 8:
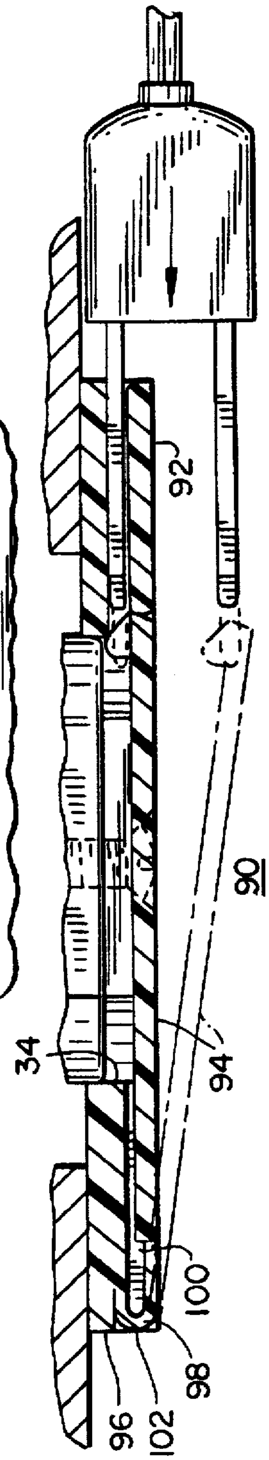
FIG. 8 is a cross-sectional view of the embodiment taken along line VIII—VIII of FIG. 7.

Referring to FIGS. 7 and 8, an outlet cover 90 of another embodiment of the invention is shown which is similar to the above described embodiments except as relates to the features discussed below. The outlet cover 90 has doors 94 hinged proximate to a first side 96 of a plate member 92. The doors 94 are hinged to the plate member 92 by a living hinge 98 which is formed during molding the plate member 92 and the doors 94 as a single piece structure. In a closed position, the doors 94 cover the access apertures 34 and fit within door accommodating recesses 100 in the plate member 92 to lie flush with the face surface of the plate member 92. The living hinge 98 connects to the plate member 92 at a position slightly recessed form the first side 96 so that when the door 94 is closed, a radius of the living hinge 98 presents a side edge 102 which is flush with the first side 96. Thus, when the door 94 is closed, the living hinge 98 does not protrude beyond the contours of the plate member 92. Accordingly, one continuous edge line is presented which is devoid of structural features which might attract the attention of a child and invite tampering. It is understood that while the recessed living hinge 98 has the aforesaid advantages, other hinging configurations, including strap hinges, which do not possess the noted advantages may also be substituted by those skilled in the art to practice the invention. Such substitutions are considered to be within the scope and spirit of the present invention.

The location of the living hinge 98 at the first side 96 of the plate member 92 allows the plate member 92 and the doors 94 to be molded as a single piece with the doors 94 being molded in an open position (not shown), 180° rotated from the closed position. In the 180° open position, the doors 94 lie in the same plane as the plate member 92 permitting the use of a shallow mold and simplifying the design of the mold.

While the embodiments presented in FIGS. 1–8 have doors 32, 94 which are hinged to swing from side to side in a horizontal plane, the scope of the invention is not so restricted. Other embodiments of the invention may optionally have door which swing in a top to bottom vertical plane. Similarly, the slotted openings 48 or channel recesses 64 are not limited to location on a side surface. Avenues of access to the latching mechanism 44 or doors 32, 94 may also be located on top and bottom sides of the plate members 32, 62, 92 and may also be located on the same side as the hinges 33, 98. As stated above, such avenues of access may either permit engagement with the latching mechanism 44 or the doors 32, 94 in such a manner that the latching mechanism 44 is opened by direct pressure on the latch mechanism 44 or by indirect pressure applied by contact with the doors 32, 94 to force the doors open. Similarly, although the embodiments of FIGS. 1–8 have the doors 32, 94 closing flush with the surface of the plate members 30, 62, 92, the doors 32, 94 need not necessarily close flush with the surface of the plate members 30, 62, 92. Doors may be configured to close in a position either raised from or countersunk in a plate member. While countersunk doors would further minimize the possibility of opening due to tampering, doors which close in a position raised from the surface can be equally effective provided the latching mechanism is sufficiently sturdy to withstand pressures exerted by prying finger nails of a child. Finally, while it is desirable to mold the entire outlet covers 20, 60 and 90 as a single piece, it is realized the multiple piece construction may also be used to implement the invention. Thus, the above stated variations, being presented as an exemplary and not an exhaustive or restrictive recitation of possible configurations of the present invention, are considered to be within the scope of the invention.

Having described preferred embodiments of the invention with reference to the accompanying drawings, it is to be understood that the invention is not limited to those precise embodiments, and that various changes and modifications may be effected therein by one skilled in the art without departing from the scope or spirit of the invention as defined in the appended claims.

What is claimed is:

1. An outlet cover for covering a wall-mounted electrical outlet of the type including a socket for receiving a plug having a plurality of spaced apart prongs extending therefrom, said outlet cover comprising:

a plate member including a forward surface and a peripheral surface, said plate member receivable in overlaying mounted engagement with said electrical outlet, a distance between the wall in which the outlet is mounted and said forward surface defining a mounted plate profile;

said plate member having an aperture in said forward surface, said aperture being functionally aligned with the socket when said plate member is mounted to the electrical outlet and sufficiently sized to permit reception of the plug in the socket while said plate member is so mounted;

a door, hingeably connected with said plate member, and movable between a first position in which said door blocks access to the socket, and a second position in which said door is hinged outwardly of said plate member and plug access to the socket is permitted;

latch means for latching said door in said first position;

release means disposed between the outlet and said forward surface of said plate member for selectively disengaging said latch means and thereby enabling movement of said door to said second position;

said plate member having a passageway with an opening in said peripheral surface for providing outside access to said release means, structure defining said passageway including a forwardly disposed inner surface, said forwardly disposed inner surface being spaced a sufficient distance from the wall to permit clearance between the wall and the plug when a one of said plurality of spaced apart prongs is inserted into said passageway, said mounted plate profile being sufficiently small to permit a remainder of said plurality of spaced apart prongs to forwardly clear said forward surface of said plate member, said release means being operable by insertion of said one of said plurality of prongs into said passageway.

2. The apparatus according to claim 1 wherein said door is hingeably connected with said plate member by a living hinge.

3. The apparatus according to claim 2, wherein said living hinge is disposed proximate an edge of said aperture.

4. The apparatus according to claim 2 wherein said living hinge is disposed proximate a periphery of said plate member.

5. The apparatus according to claim 2, wherein said plate member and said door are monolithic in construction.

6. The apparatus according to claim 1 wherein the electrical outlet further includes a ground fault test switch, the apparatus further comprising said plate member having a switch access aperture positioned to align with and provide access to the ground fault test switch of the electrical outlet.

7. The apparatus according to claim 1, wherein said plate member includes a rear surface opposed to said forward surface, and said opening in said peripheral surface is located between said forward surface and said rear surface.

8. The apparatus according to claim 1, wherein:

said plate member includes a rear surface opposed to said forward surface;

said outlet includes a faceplate; and said passageway is defined by a recess in said rear surface and by the faceplate of the outlet.

9. The apparatus according to claim 1 further comprising said door having a shape substantially conforming to a perimeter of said aperture allowing said door to fit within said aperture in said first position and lie substantially flush with said forward surface.

10. The apparatus according to claim 9 wherein the electrical outlet further includes a ground fault test switch, the apparatus further comprising said plate member having a switch access aperture positioned to align with and provide access to the ground fault test switch of the electrical outlet.

11. The apparatus according to claim 10 wherein said switch access aperture, in combination with said ground fault switch, presents a sole discontinuity in a plane of said forward surface when said door is in said first position.

12. The apparatus according to claim 1, wherein:

said door is hingeably connected to said plate member by a living hinge at a side of said peripheral surface opposite said opening of said passageway such that when said door is fully opened into a plane of said plate member said living hinge is unflexed; and said forward surface has a recess provided therein between said aperture and said side of said peripheral surface opposite said opening of said passageway for receiving said door in said first position such that said door is flush with said forward surface.

13. The apparatus according to claim 1, wherein said plate member and said door are configured to permit reception of said door a distance into said plate member sufficient to permit an outwardly facing surface of said door to lie in substantially flush alignment with said forward surface of said plate member when in said first position.

14. The apparatus according to claim 13, wherein said plate member includes a door accommodating recess having a depth permitting said flush alignment, said door accommodating recess concomitantly preventing inward movement of said door relative said plate member once said flush alignment is attained in said first position.

15. The apparatus according to claim 14, wherein:

said door is hingeably connected with said plate member by a hinge; and said door accommodating recess includes a recessed portion in said plate member extending from said hinge to a portion of a perimeter of said aperture sufficient in width to receive a portion of said door extending from said hinge to said portion of said perimeter when said door is in said first position.

* * * * *